(12) United States Patent
Kim et al.

(10) Patent No.: US 9,299,905 B2
(45) Date of Patent: Mar. 29, 2016

(54) THERMOELECTRIC DEVICE AND THERMOELECTRIC MODULE HAVING THE SAME, AND METHOD OF MANUFACTURING THE SAME

(75) Inventors: Se Joon Kim, Seoul (KR); Jong Bae Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 213 days.

(21) Appl. No.: 13/981,739

(22) PCT Filed: Jan. 20, 2012

(86) PCT No.: PCT/KR2012/000527
§ 371 (c)(1),
(2), (4) Date: Aug. 13, 2013

(87) PCT Pub. No.: WO2012/102523
PCT Pub. Date: Aug. 2, 2012

(65) Prior Publication Data
US 2013/0319495 A1    Dec. 5, 2013

(30) Foreign Application Priority Data

Jan. 25, 2011 (KR) .................. 10-2011-0007495

(51) Int. Cl.
| | |
|---|---|
| *H01L 35/02* | (2006.01) |
| *H01L 35/26* | (2006.01) |
| *H01L 35/32* | (2006.01) |
| *H01L 35/34* | (2006.01) |
| *H01L 35/00* | (2006.01) |

(52) U.S. Cl.
CPC ................ *H01L 35/02* (2013.01); *H01L 35/26* (2013.01); *H01L 35/32* (2013.01); *H01L 35/34* (2013.01); *H01L 35/00* (2013.01)

(58) Field of Classification Search
CPC ......... H01L 35/00; H01L 35/02; H01L 35/26; H01L 35/32; H01L 35/34
See application file for complete search history.

(56) References Cited

U.S. PATENT DOCUMENTS

| | | |
|---|---|---|
| 6,710,238 B1 | 3/2004 | Shingu et al. |
| 2006/0210790 A1* | 9/2006 | Horio et al. .................... 428/323 |
| 2009/0139244 A1* | 6/2009 | Ullo et al. ......................... 62/3.6 |
| 2010/0108115 A1 | 5/2010 | Lee et al. |
| 2011/0114145 A1 | 5/2011 | Yang et al. |

FOREIGN PATENT DOCUMENTS

| | | |
|---|---|---|
| CN | 1541422 A | 10/2004 |
| CN | 201663181 U | 12/2010 |

(Continued)

OTHER PUBLICATIONS

Cao, "Synthesis and thermoelectric properties of Bi 2 Te 3/Sb 2 Te 3 bulk nanocomposites with laminated nanostructure", Applied Physics Letters, 2008.*

(Continued)

*Primary Examiner* — Matthew Martin
(74) *Attorney, Agent, or Firm* — Saliwanchik, Lloyd & Eisenschenk

(57) ABSTRACT

The present invention relates to a thermoelectric device using a bulk material of a nano type, a thermoelectric module having the thermoelectric device and a method of manufacturing thereof. According to the present invention, thin film of a nano thickness is formed on a bulk material formed as several nano types to be re-connected for prohibiting the phonon course.

15 Claims, 4 Drawing Sheets

(56) References Cited

FOREIGN PATENT DOCUMENTS

| JP | 2005-251917 A | 9/2005 |
| KR | 10-2002-0008210 A | 1/2002 |
| KR | 10-2010-0045190 A | 5/2010 |
| KR | 10-2010-0056478 A | 5/2010 |
| KR | 10-2012-0019536 A | 3/2012 |
| WO | WO-2010/073391 A1 | 7/2010 |
| WO | WO-2012/026678 A2 | 3/2012 |

OTHER PUBLICATIONS

International Search Report in International Application No. PCT/KR2012/000527, filed Jan. 20, 2012.
European Search Report dated Apr. 30, 2014 in European Application No. 12738945.0.
Office Action dated Aug. 25, 2015 in Chinese Application No. 201280010817.6.

* cited by examiner

THERMOELECTRIC DEVICE AND THERMOELECTRIC MODULE HAVING THE SAME, AND METHOD OF MANUFACTURING THE SAME

CROSS-REFERENCE TO RELATED APPLICATIONS

This application is the U.S. national stage application of International Patent Application No. PCT/KR2012/000527, filed Jan. 20, 2012, which claims priority to Korean Application No. 10-2011-0007495, filed Jan. 25, 2011, the disclosures of each of which are incorporated herein by reference in their entirety.

TECHNICAL FIELD

The present invention relates to a thermoelectric device using a bulk material of a nano type, a thermoelectric module having the thermoelectric device and a method of manufacturing thereof.

BACKGROUND ART

The present invention relates to a thermoelectric device using a bulk material of a nano type, a thermoelectric module having the same and a method of manufacturing the same, and more particularly, to a thermoelectric device having a high figure of merit by forming a thin film of a nano thickness on a base material of a nano type, a thermoelectric module including the thermoelectric device and a method of manufacturing the module.

DISCLOSURE OF INVENTION

Technical Problem

Generally, a thermoelectric device including thermoelectric converting elements is configured such that P-type thermoelectric material and N-type thermoelectric material are bonded between the metal electrodes to form a PN bonding pair.

Meanwhile, when temperature difference is applied between the PN bonding pair, electric power is produced through a Seeback effect and thus the thermoelectric device serves as a power generation device. Further, when one part of the PN boding pair is cooled and the other part thereof is heated, the thermoelectric device serves as a temperature control device by using Peltier effect.

Here, the Peltier effect refers to such that, as shown in FIG. 1, p-type material hole and N-type material electron are moved when applying external DC voltage thereto to generate and absorb heat on both ends of the material. The Seeback effect refers to such that, as shown in FIG. 2, the hole and electron are moved to make current to be flowed through the material to generate electric power when receiving external heat.

An active cooling by using the thermoelectric material improves a device thermal stability and further considers as a friendly environment method since there is little noise and vibration and further it does not use a separate condenser and refrigerant and thus accommodates a small amount of space. The application fields for the active cooling using the thermoelectric material refer to as a non-refrigerant refrigerator, air conditioner, various micro-cooling system, or the like and specially when the thermoelectric device is attached to various memory devices, the device is kept in regular and stable temperature while reducing the volume of the device, to improve an performance thereof.

Meanwhile, when the thermoelectric material is used in a filed of thermoelectric power generation through the Seeback effect, the waste heat can be used as a energy source and thus the thermoelectric power generation system may be applied to the fields of vehicle engine and exhausting device, a trash incineration site, steel mill waste heat, medical instrument power source using human body heat, which intend to improve energy efficiency and recover the waste heat.

A factor for measuring a performance of the thermoelectric material refers to a dimensionless performance index ZT (hereinafter, referred to as 'figure of merit') defined by the following mathematical formula 1.

$$ZT = \frac{S^2 \sigma T}{k} \qquad \text{[Formula 1]}$$

Here, 'S' is seeback coefficient, 'σ' is electrical conductivity, 'T' is absolute temperature and 'k' is heat conductivity.

Hereinafter, a configuration of a thermoelectric module according to a prior art will be described, referring to the accompanied drawings.

FIG. 3 is a longitudinal-sectional view showing a configuration of a thermoelectric module according to a prior art.

As shown in FIG. 3, an upper substrate 11 and a lower substrate 12 are provided on the respective upper and lower surface of a thermoelectric module 10. The upper substrate 11 and the lower substrate 12 serve to emit or absorb and are kept in a state of being spaced from each other at a predetermined distance. An N-type semiconductor 15 and a P-type semiconductor 16 are provided between the upper and lower substrates 11, 12. The N-type semiconductor 15 and the P-type semiconductor 16 are formed for the thermoelectric material to have a predetermined shape and size wherein they are arranged alternatively between the upper and lower substrates 15, 16.

A metal electrode 17 is provided between the N-type semiconductor 15 and the P-type semiconductor 16, and the upper substrate 11 to connect the N-type semiconductor 15 and the P-type semiconductor 16.

A metal layer 25 is provided on a lower part of the metal electrode 17 for the atoms being moved from the metal electrode 17 not to be flowed into the N-type semiconductor 15 and the P-type semiconductor 16 wherein the metal layer 25 is made of Nickel and contains a small amount of phosphorus or boron. That is, the metal layer 25 blocks a degradation of the thermoelectric property and stabilizes the thermoelectric property wherein the metal layer 25 is coated to the metal electrode 17.

A barrier layer 27 is provided between the N-type semiconductor 15 and the P-type semiconductor 16. The barrier layer 27 avoids the N-type semiconductor 15 and the P-type semiconductor 16 being contaminated from a soldering layer 26, which will be described later.

A soldering layer 26 is provided between the metal layer 25 and the barrier layer 27 for keeping a bonding state of the metal layer 25 and the barrier layer 27. Here, a N-bonding point 20 and a P-boding point 21 are placed on lower parts of the soldering layer 26, respectively.

The N-boding point 20 and the P-boding point 21 are attached to the lower parts of the N-type semiconductor 15 and the P-type semiconductor 16, respectively, serve to supply power source to the N-type semiconductor 15 and the P-type semiconductor 16.

Meanwhile, the prior thermoelectric device for cooling has been manufactured in a bulk type, and a nano type thereof has been studied actively. Since in the case of the bulk type, only the thermoelectric device having a low figure of merit ZT and low efficient is manufactured, the study is changed from the bulk type to the nano type. However, even if case of the nano type, the figure of merit is increased, there is limitation to cost and application fields.

Solution to Problem

The present invention has been proposed to solve the drawbacks as described in the forgoing. In order to resolve the drawbacks, the object of the present invention relates to provide a thermoelectric device using a bulk material of a nano type, a thermoelectric module having the thermoelectric device and a method of manufacturing thereof in which thin film of a nano thickness is formed on a bulk material formed as several nano types to be re-connected for prohibiting the phonon course and thus the thermoelectric device has higher figure of merit, compared to an existing bulk type, and saves manufacturing cost thereof and the numbers of manufacturing process.

Another object of the present invention relates to provide a thermoelectric device using a bulk material of a nano type, a thermoelectric module having the thermoelectric device and a method of manufacturing thereof in which through the combined method of forming the nano particles on the bulk type material to manufacturing at a time the bulk type of a nano structure, thereby saving the thermoelectric device of a thin film type and having higher figure of merit than that of the bulk type.

Further, still another object of the present invention relates to provide a thermoelectric device using a bulk material of a nano type, a thermoelectric module having the thermoelectric device and a method of manufacturing thereof in which at an initial state the bulk type of a nano structure is manufactured to decrease the numbers of the process, compared to the prior art where after manufacturing the bulk type, the nano particles are doped (precipitated).

In order to achieve the objects of the present invention, a thermoelectric device according to an embodiment of the present invention comprises a thermoelectric semiconductor base material formed using a bulk material of a nano type and a phonon scattering film formed one surface of the thermoelectric semiconductor base material wherein a plurality of the thermoelectric semiconductor base material each has the phonon scattering film are laminated to one direction.

Furthermore, a thermoelectric module according to another embodiment of the present invention comprises a first and second substrates each including a metal electrode and arranged in an opposite direction and a plurality of thermoelectric devices arranged between the first and second substrates wherein the thermoelectric device is formed by laminating a plurality of thermoelectric semiconductor base material using bulk material of a nano type to one direction, on one surface of which the phonon scattering film is formed, and the thermoelectric device is made of a P-type semiconductor and N-type semiconductor.

Advantageous Effects of Invention

According to the present invention, a thin film of nano thickness is formed on a nano base material configured as several nano types to be re-combined and thus the phonon course is prohibited to have higher figure of merit than that of the existing bulk type.

In addition, when manufacturing the thermoelectric device of a thin film type, high manufacturing cost is not demanded and further higher figure of merit is obtained, compared to the bulk type.

Further, the numbers of the process cab be decreased by forming initially the bulk type of nano structure, compared to the prior art where after the bulk type, the nano particles are doped (precipitated).

Furthermore, the phonon movement is prohibited without using the supper lattice which is formed by piling continuously the thin films through the vaporization process demand for high manufacturing cost even though high figure of merit.

BRIEF DESCRIPTION OF DRAWINGS

The above and other aspects, features and advantages of certain exemplary embodiments of the present invention will be more apparent from the following description taken in conjunction with the accompanying drawings, in which.

MODE FOR THE INVENTION

Figure 1:
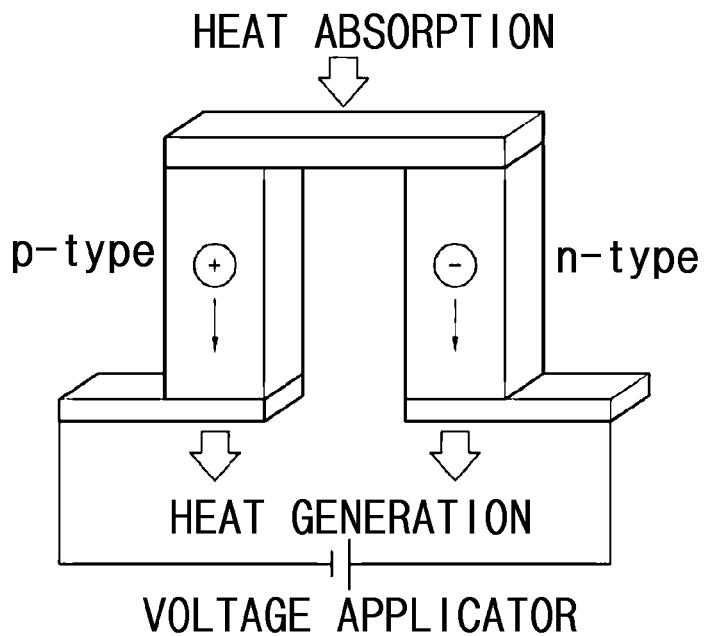
FIG. 1 is a perspective view showing a thermoelectric cooling by using Peltier effect.
Figure 2:
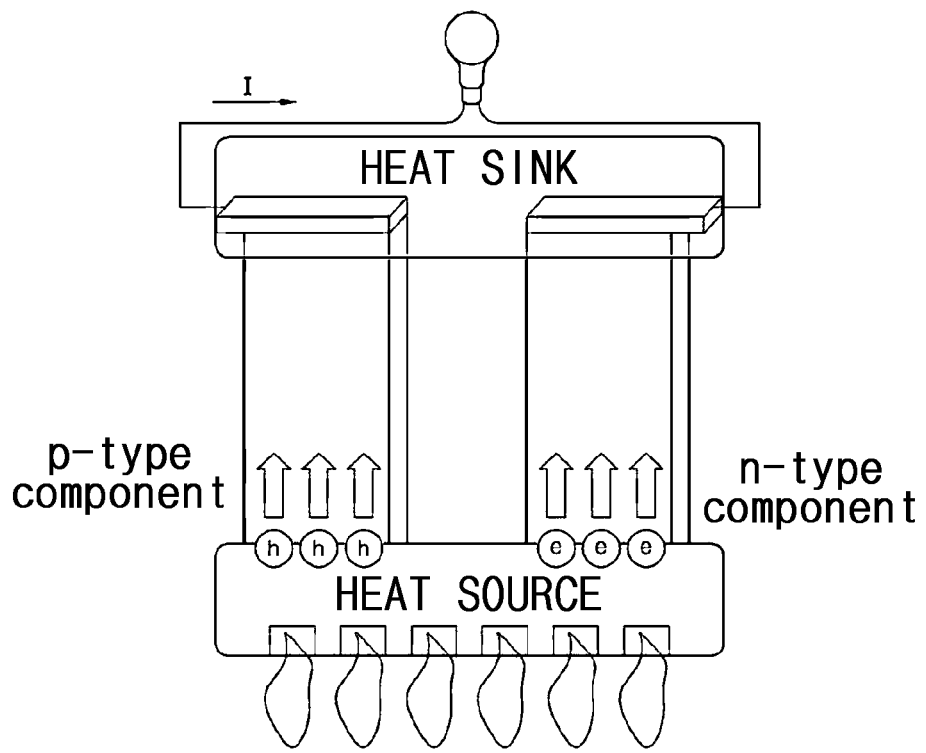
FIG. 2 is a perspective view showing a thermoelectric power generation by using Seeback effect.
Figure 3:
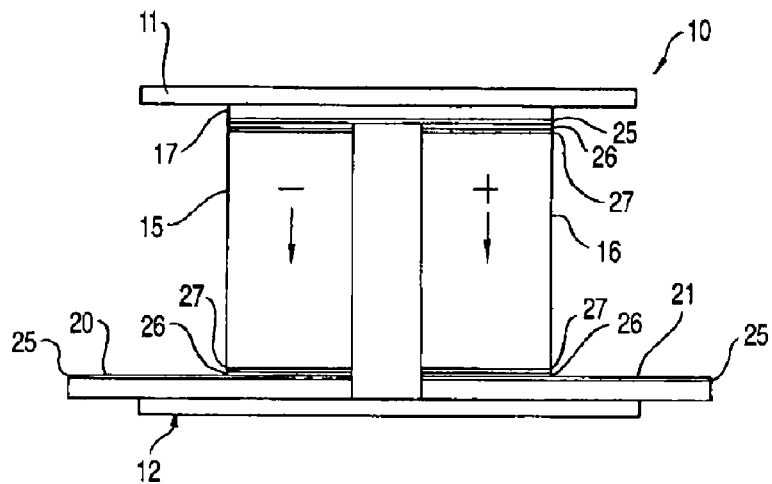
FIG. 3 is a longitudinal-sectional view showing inner parts of a thermoelectric module according to the prior art.
Figure 4:
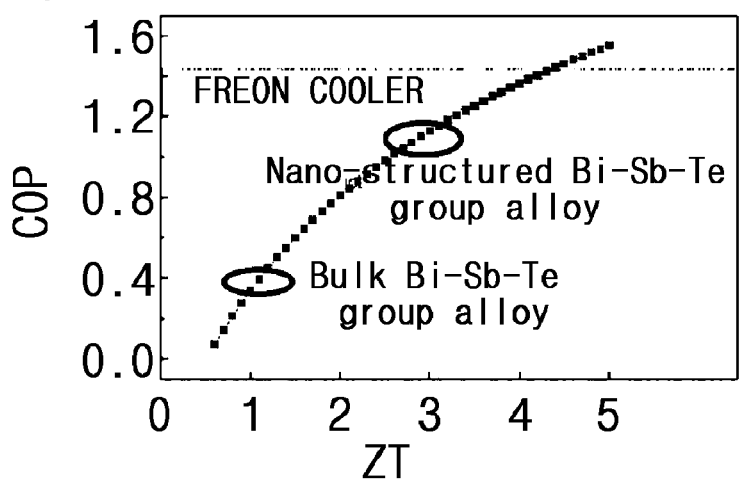
FIG. 4 is a graph showing a correlation between a figure of merit ZT and a coefficient performance COP of a thermoelectric device of a bulk type and a nano type according to a prior art.

Hereinafter, embodiments of the present invention are described below in detail, with reference to the accompanying views. However, the present invention may be implemented in various and different forms and not limited to the embodiments described here. In addition, in order to clearly describe the present invention, parts that are not related with the description are omitted, and the same reference numerals will be used to refer to the same elements throughout the specification.

Figure 5:
FIGS. 5 to 7 cross-sectional views showing a manufacturing process of a thermoelectric device using bulk material of a nano type according to an embodiment of the present invention.
Figure 6:
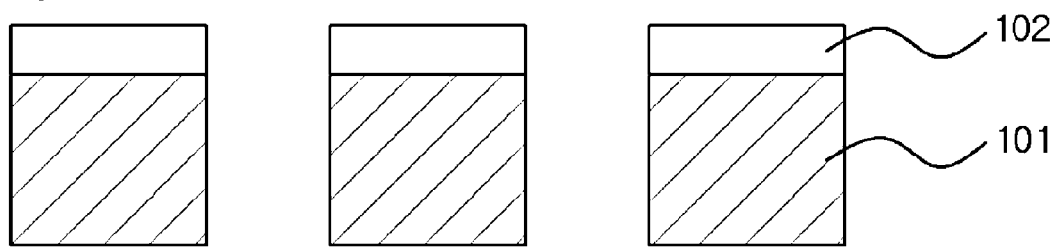
Figure 7:
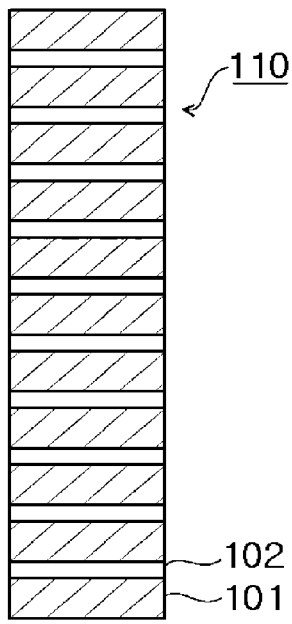

FIGS. 5 to 7 cross-sectional views showing a manufacturing process of a thermoelectric device using bulk material of a nano type according to an embodiment of the present invention.

Firstly, as shown in FIG. 5, a thermoelectric semiconductor base material 101 in a thickness of 10 nm-2 mm is provided by using nano bulk material (polycrystalline material made of nano crystal grains as a single crystal in a thickness of less than 100 nm). In a preferred embodiment, the base material may formed in a thickness of 1-2 mm by laminating the nano material since as the numbers of laminating layers increases, phonon scattering becomes large and as a result heat conductivity is lowered to improve greatly a performance thereof.

That is, even though the base material for a thermoelectric semiconductor is in a bulk type, the inner part thereof is in a nano type.

The base material for a thermoelectric semiconductor as manufactured in the forgoing may be an N-type semiconductor or a P-type semiconductor.

At this time, the thermoelectric device using the bulk material of a nano type may be manufactured by using a two-step sintering (room temperature sintering), a pressing sintering, a hot isostatic pressing (HIP) sintering, a spark plasma sintering (SPS), a microwave sintering, an electrically assisted sintering, or the like, for increasing a mechanical strength, and these sintering methods will be described later.

In a preferred embodiment of the present invention, the thermoelectric semiconductor base material is made of BiTe group by using the pressing sintering method, through which a phonon movement for inducing heat transfer is prevented due to nano type property. The thermoelectric semiconductor base material may be made of any one selected from a BiTe group of Sb, Se, B, Ga, Te, Bi, In, Ag, and $Al_2O_3$.

After that, as shown in FIG. 6, a thin film 102 (phonon scattering film) for scattering phonon in one direction of the thermoelectric semiconductor base material (P, N) 101 formed in a nano type are coated or deposited (thin film).

At this time, a thickness of the phonon scattering film may be 10-100 nm since in the case that the thickness of the phonon scattering film is greater than 100 nm, the scattering made inside the thermoelectric semiconductor base material is made actively to decrease the coefficient performance, thereby lowing greatly the efficient. Furthermore, in the case of the thickness being less than 10 nm, a phonon scattering function is lowered.

Here, the phonon scattering film may be formed by using a sputtering and evaporation, or the like. Further, the phonon scattering film may be made of any one selected from a BiTe group of Sb, Se, B, Ga, Te, Bi, In, Ag, and $Al_2O_3$.

After that, as shown FIG. 7, a plurality of the thermoelectric semiconductor base materials 101 on which the phonon scattering film 102 is formed, respectively, are boned in one row of one direction to form a thermoelectric device 110. In this case, the thermoelectric device may be formed as a lamination of 2-200 thermoelectric base materials. Further, in a more preferable embodiment, 50-100 thermoelectric base materials may be laminated for implementing optimum effect of process efficiency and performance improvement.

Figure 8:
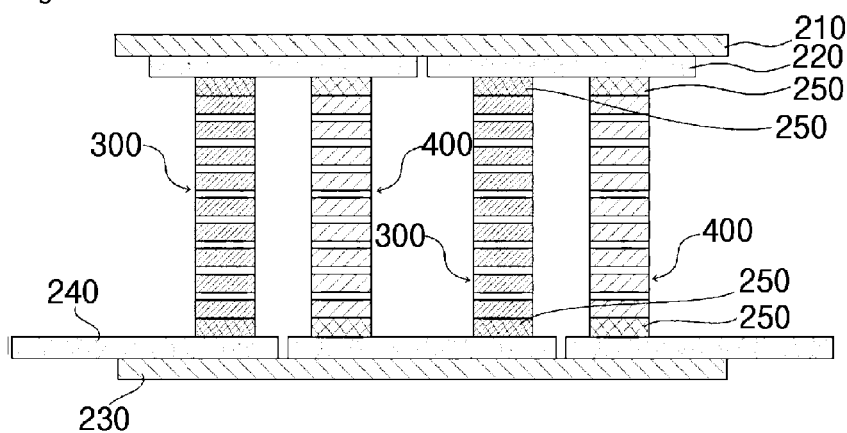
FIG. 8 is a cross-sectional view showing a thermoelectric module including a thermoelectric device manufactured by using bulk material of a nano type according to a preferred embodiment of the present invention.

FIG. 8 is a cross-sectional view showing a thermoelectric module including the thermoelectric device using bulk material of nano type according to a preferred embodiment of the present invention.

The thermoelectric module, as shown in FIG. 8, includes a second electrode 240 patterned on the second substrate and an anti-diffusion film 250 formed on the second electrode 240. At this time, the anti-diffusion film 250 serves to prevent the metal from being diffused between second electrode 240 and a thermoelectric device which is formed later and may be made of Nickel. Further, the second substrate 230 is dielectric and is made of alumina plate and the second electrode 240 is made of cupper electrode.

In subsequent, the thermoelectric devices 300, 400 of P-type and N-type are arranged alternatively on the second electrode 240 and the anti-diffusion film 250 is formed on the thermoelectric devices 300, 400 and then the first electrode 220 is formed on the anti-diffusion film 250. At this time, the anti-diffusion film 250 and the first electrode 230 are made of the same material as the second electrode 240 formed on the second substrate 230.

Continuously, the first substrate 210 is attached on the first electrode 220 to form the electrode module. Here, when arranging the thermoelectric modules 300, 400, P-type and N-type are arranged alternatively and the anti-diffusion film 250 and the first and second electrodes 220, 240 are formed on the connection surface. In manufacturing process of the thermoelectric module, even though a laminating in sequence of the first electrode, the thermoelectric device, and the anti-diffusion film is disclosed, however, it necessarily is not limited thereto, and they may be laminated on the first substrate, or the first electrode and the second electrode are laminated over the first and second substrates and the anti-diffusion film, and then is connected to the thermoelectric device.

In the present invention, the first and second electrodes 220, 240 may be made of at least one or alloy thereof selected from a group of Cu, Ag, Ni, Al, Au, Cr, Ru, Re, Pb, Sn, In and Zn, and the anti-diffusion film 250 may be made of at least one or alloy thereof of Cu, Ag, Ni, Al, Au, Cr, Ru, Re, Pb, Sn, In and Zn depending on the materials of the first and second electrodes 220, 240.

In the case of the thermoelectric device and the thermoelectric module including the thermoelectric device according to the present invention, when they are made of only existing bulk material, the performance is improved at about 50% greater than the existing performance, and when the phonon scattering film 102 is provided, about 25% greater performance at the existing material is improved. Here, referring to about 1 of the figure of merit ZT, when a thin film is formed on a nano bulk type, the performance is improved to 1.8.

Furthermore, according to the present invention, high efficiency is impossible, compared to the existing bulk type. Additionally, the phonon movement can be prevented, without using a supper lattice formed by laminating continuously the thin films using a vaporization method demanding high cost even high thermoelectric efficiency.

TABLE 1

|  | Bulk TEM | Nano Dot TEM | Super Lattice TEM | Nano-structure Bulk + thin Film TEM |
|---|---|---|---|---|
| ZT | 1.0 | 1.5 | 2.5 | 1.8 |

In the following, a manufacturing method of the thermoelectric device of bulk material of a nano type will be described.

1. Two-Step Sintering

The thermoelectric semiconductor base material is prepared by being sintered at a high temperature of short time period (more than 70% being densified) and fully densified at a lower temperature. In contrast to this, in a general sintering, after 90% is densified, and an abrupt crystal grain growth is made.

2. Hot Pressing Sintering

The thermoelectric semiconductor base material is prepared by applying high pressure and being sintered in order to solve difficult-sintering material and remaining bubbles being existed in the two-step sintering process. Through this process, the crystal grain growth is prohibited due to an internal pressure formed inside the powder while applying high pressure and helping the densification. Further, the base material is under a different thermodynamic state from the two-step sintering due to the applied high pressure energy, and thus the sintering is made at a lower temperature, compared to the two-step sintering.

3. Hot Isostatic Pressing (HIP) Sintering

The thermoelectric semiconductor base material is prepared by blowing an inert gas such as argon into a container to accelerate the densification of the formed body due to a gas pressure. Typically, the sintering by using a gas pressure is classified as a gas pressing sintering of less than 20 MPa and the hot isostatic pressing sintering of greater than 20 MPa.

4. Spark Plasma Sintering (SPS)

The thermoelectric semiconductor base material is prepared by pressurized-sintering it using high temperature plasma produced in a gap between the powders with pulsed-type DC. In an initial state of the sintering, the plasma is produced between particles as an exothermic reaction due to excessive amount current. Here, when a neck is formed on a contact point between the particles due to this heat, joule heating is produced by current. Meanwhile, the sintering process proceeds to some extent, the plasma is not produced further; however, the thermoelectric semiconductor base material is kept in further densification. In the case of the Spark Plasma Sintering, since the energy necessary for the sintering is produced within the filled particles, not from an external source, the sintering at a lower temperature is possible, compared to other sintering methods.

5. Microwave Sintering

The thermoelectric semiconductor base material is prepared by using microwave heat source and thus high speed heating is possible to decrease dramatically the sintering time period, thereby prohibiting the crystal grain growth. Specially, in this process, self volume exothermic reaction is induced by the microwave to heat rapidly the whole forming body and decrease thermal gradient inside the specimen. Further, the sintering temperature cab be lowered by about 100 degree by combining the laser process to form a Microwave-Laser hybrid method.

In the thermoelectric device using the bulk material of a nano type and the thermoelectric module using the thermoelectric device and the manufacturing method thereof solves the technical object of the present invention by forming the thin film of a nano thickness on the bulk material to have high the figure of merit.

Figure 9:
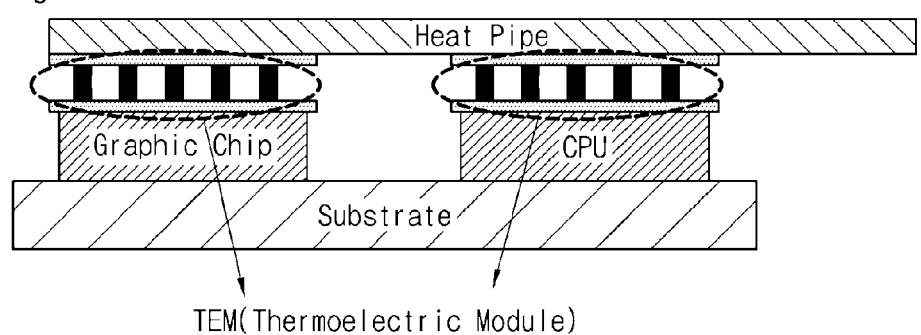
FIGS. 9 and 10 are views showing an unit for releasing heat by using the thermoelectric module according to the present invention.
Figure 10:
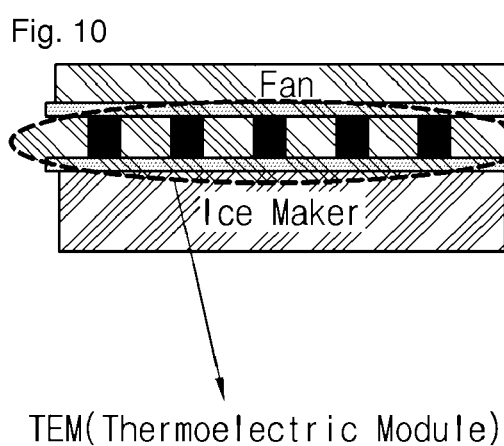

FIGS. 9 and 10 are views showing an unit for releasing heat by using the thermoelectric module according to the present invention.

In the configuration as shown in FIG. 9, the thermoelectric module (TEM) according to the present invention is mounted on one surface of various graphic chips or CPU which is mounted to a substrate of electron products such as a computer, or the like and a heat pipe is attached to one surface of the thermoelectric module according to the present invention.

In the configuration as shown in FIG. 10, the thermoelectric module (TEM) according to the present invention is mounted to one surface of an ice maker in a refrigerator and a fan for releasing heat is attached closely to an opposite surface thereof.

That is, the thermoelectric module according to the present invention may be used as an ice maker in a refrigerator, car seat, air conditioner, and CPU cooler, or the like. Namely, the thermoelectric module may be provided with a fan and heat pipe for releasing heat produced in an electronic product or electric circuit.

According to the present invention, a thin film of nano thickness is formed on a nano base material configured as several nano types to be re-combined and thus the phonon course is prohibited to have higher figure of merit than that of the existing bulk type.

In addition, when manufacturing the thermoelectric device of a thin film type, high manufacturing cost is not demanded and further higher figure of merit is obtained, compared to the bulk type.

Further, the numbers of the process cab be decreased by forming initially the bulk type of nano structure, compared to the prior art where after the bulk type, the nano particles are doped (precipitated).

Furthermore, the phonon movement is prohibited without using the supper lattice which is formed by piling continuously the thin films through the vaporization process demand for high manufacturing cost even though high figure of merit.

While the invention has been shown and described with reference to exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

The invention claimed is:

1. A thermoelectric device comprising:
   a thermoelectric semiconductor base formed with polycrystal material comprising nanocrystal grains in a single phase, and having a thickness in a range of 10 nm to 2 mm; and
   a phonon scattering film disposed on one surface of the thermoelectric semiconductor base, and having a thickness in a range of 10 nm to 100 mm,
   wherein the thermoelectric semiconductor base comprises a plurality of thermoelectric semiconductor base layers that are laminated, and the phonon scattering film is disposed between adjacent thermoelectric semiconductor base layers; and
   wherein the plurality of thermoelectric semiconductor base layers is made of a same material.

2. The thermoelectric device of claim 1, wherein the plurality of thermoelectric semiconductor base layers is configured such that a P-type semiconductor of the thermoelectric semiconductor base is laminated in a multilayered form and the phonon scattering film is disposed therebetween, or an N-type semiconductor of the thermoelectric semiconductor base is laminated in a multilayered form and the phonon scattering film is disposed therebetween.

3. The thermoelectric device of claim 2, wherein the thermoelectric semiconductor base is formed with any one of a BiTe group containing Sb, Se, B, Ga, Te, Bi, In, Ag, and $Al_2O_3$.

4. The thermoelectric device of claim 2, wherein the plurality of thermoelectric semiconductor base layers comprises between 40 and 100 thermoelectric semiconductor base layers.

5. The thermoelectric device of claim 4, wherein the phonon scattering film is formed with any one of a BiTe group containing Sb, Se, B, Ga, Te, Bi, In, Ag, and $Al_2O_3$.

6. A thermoelectric module comprising:
   a first substrate and a second substrate each including a metal electrode, and disposed to face each other; and
   a plurality of thermoelectric devices disposed between the first substrate and the second substrate;
   wherein each of the thermoelectric devices comprises: a thermoelectric semiconductor base formed with a polycrystal material comprising nanocrystal grains in a single phase, the thermoelectric semiconductor base having a thickness in a range of 10 nm to 2 mm; and a phonon scattering film disposed on one surface of the thermoelectric semiconductor base, and the phonon scattering film having a thickness in a range of 10 nm to 100 mm;

wherein the thermoelectric semiconductor base comprises a plurality of thermoelectric semiconductor base layers, and the phonon scattering film is disposed between adjacent thermoelectric semiconductor base layers; and wherein the plurality of thermoelectric semiconductor base layers is configured such that a P-type semiconductor of the thermoelectric semiconductor base has multilayers, or an N-type semiconductor of the thermoelectric semiconductor base has multilayers.

7. The thermoelectric module of claim 6, wherein the thermoelectric module further comprises a first and second electrodes formed by patterning them on inner surfaces of the first and second substrates, respectively, and an anti-diffusion film inhibiting metal diffusion formed between the P-type semiconductor and the N-type semiconductor.

8. The thermoelectric module of claim 7, wherein each of the first and second substrates comprises an alumina substrate and each of the first and second electrodes is made of at least one of Cu, Ag, Ni, Al, Au, Cr, Ru, Re, Pb, Sn, In, Zn, and alloys of any thereof; and wherein the anti-diffusion film and the first and second electrodes are made of a same material.

9. The thermoelectric module of claim 8, wherein the anti-diffusion film is made of at least one of Cu, Ag, Ni, Al, Au, Cr, Ru, Re, Pb, Sn, In, Zn, and alloys of any thereof.

10. A manufacturing method of the thermoelectric device according to claim 1, comprising:
    forming a phonon scattering film having a thickness in a range of 10 nm to 100 mm on one surface of a thermoelectric semiconductor base; and
    forming the thermoelectric semiconductor base comprising a plurality of thermoelectric semiconductor base layers in a lamination structure on the phonon scattering film in one direction, the thermoelectric semiconductor base layers having a same structure and material as a structure and material of the non scattering film.

11. The manufacturing method of claim 10, wherein the forming a thermoelectric semiconductor base is performed with any one of a two-step sintering, a pressurized sintering of a thermoelectric semiconductor material, a hot isostatic pressing (HIP) sintering, a spark plasma sintering (SPS), a microwave sintering, and an electrically assisted sintering.

12. The manufacturing method of claim 10, wherein the thermoelectric semiconductor base is formed with any one of a BiTe group containing Sb, Se, B, Ga, Te, Bi, In, Ag, and $Al_2O_3$.

13. The manufacturing method of claim 10, wherein the forming a phonon scattering film is performed with a coating or an evaporation process.

14. The manufacturing method of claim 10, wherein the phonon scattering film is formed with any one of a BiTe group containing Sb, Se, B, Ga, Te, Bi, In, Ag, and $Al_2O_3$.

15. A manufacturing method of a thermoelectric module, comprising:
    forming a phonon scattering film having a thickness in a range of 10 nm to 100 mm on one surface of a thermoelectric semiconductor base;
    forming the thermoelectric semiconductor base comprising a plurality of thermoelectric semiconductor base layers with a lamination structure on the phonon scattering film in one direction, the thermoelectric semiconductor base having a same structure as that of the phonon scattering film; and
    alternately arranging a P-type thermoelectric semiconductor and an N-type thermoelectric semiconductor of the thermoelectric semiconductor base, the P-type and N-type thermoelectric semiconductors being configured such that the thermoelectric semiconductor base layers are laminated between a first substrate and a second substrate disposed to face each other.

* * * * *